United States Patent [19]

Sayama et al.

[11] Patent Number: 5,300,820
[45] Date of Patent: Apr. 5, 1994

[54] INPUT INTERFACE CIRCUIT FOR REMOVING NOISE COMPONENTS OF AN INPUT SIGNAL

[75] Inventors: Masahiko Sayama; Toshiro Hara, both of Himeji, Japan

[73] Assignee: Mitsubishi Denki Kabushiki Kaisha, Tokyo, Japan

[21] Appl. No.: 13,559

[22] Filed: Feb. 4, 1993

Related U.S. Application Data

[63] Continuation of Ser. No. 729,676, Jul. 15, 1991, abandoned.

[30] Foreign Application Priority Data

Jul. 17, 1990 [JP] Japan ................. 2-191659

[51] Int. Cl.$^5$ ............................................. H03K 5/22
[52] U.S. Cl. .................... 307/234; 307/520; 307/518; 328/111; 328/164
[58] Field of Search ............... 307/234, 542.1, 543, 307/520, 518; 328/111, 164

[56] References Cited

U.S. PATENT DOCUMENTS

| 4,282,489 | 8/1981 | DeRienzo . | |
|---|---|---|---|
| 4,427,948 | 1/1984 | Rinaldi | 307/542.1 |
| 4,525,635 | 6/1985 | Gillberg | 307/234 |
| 4,578,653 | 3/1986 | Howell | 307/520 |
| 4,847,577 | 7/1989 | Gerhart et al. | 328/111 |
| 4,967,108 | 10/1990 | Lee et al. | 307/520 |
| 5,001,374 | 3/1991 | Chang | 307/520 |

FOREIGN PATENT DOCUMENTS

| 2424816 | 12/1975 | Fed. Rep. of Germany . |
| 2415365 | 2/1978 | Fed. Rep. of Germany . |
| 2722981 | 10/1980 | Fed. Rep. of Germany . |
| 237033A1 | 6/1986 | Fed. Rep. of Germany . |
| 2847290C2 | 9/1986 | Fed. Rep. of Germany . |
| 3814877A1 | 3/1989 | Fed. Rep. of Germany . |
| 54-33885 | 2/1980 | Japan . |

Primary Examiner—Timothy P. Callahan
Attorney, Agent, or Firm—Sughrue, Mion, Zinn, Macpeak & Seas

[57] ABSTRACT

Each channel of an input interface circuit for suppressing noise contained in input signals to a CPU (microcomputer) of an automobile includes: a level determining circuit for shaping the waveform; a clock circuit for generating sampling clock pulses; a sequential memory circuit, clocked by the clock pulses, for sampling the output levels of the level determining circuit and storing at least two successive output levels; and a resetting circuit which is set when all the levels stored in the sequential memory circuit are high, and which is reset when all the levels stored in the sequential memory circuit are low. The noise pulses contained in the output of level determining circuit are thus effectively removed.

3 Claims, 4 Drawing Sheets

(a)

(b)

(c)

(d)

(e)

(a)

(b)

(c)

INPUT INTERFACE CIRCUIT FOR REMOVING NOISE COMPONENTS OF AN INPUT SIGNAL

This is a continuation of application Ser. No. 07/729,676 filed Jul. 15, 1991 and now abandoned.

BACKGROUND OF THE INVENTION

This invention relates to input interface circuits for removing noise from input signals supplied to electronic circuit components such as microcomputers which control an automotive engine, etc.

FIG. 5 is a circuit diagram showing the organization of a conventional input interface circuit for an automotive microcomputer (CPU), and FIG. 6 shows waveforms generated within the circuit of FIG. 5. In accordance with the states of the automobile, switches 1 are turned on and off. The resulting signals are inputted to the input interface circuit 12 via the input terminals 2. Each channel for the input signals includes: a pull-down resistor 3a or a pull-up resistor 3b; a resistor 4 and a capacitor 28 constituting an RC filter; diodes 5 and 6 for providing protection against input voltage surges; resistors 29 and 30; a transistor 31 for waveform shaping; and a pull-up resistor 32.

The operation of the input interface circuit for the upper input channel is as follows. When the switch 1 is turned on to turn on the transistor 31, the input to the CPU (microcomputer) 13 goes from the high to the low state. In response thereto, the CPU (microcomputer) 13 outputs an appropriate control signal for the automobile.

When an input waveform as shown at FIG. 6(a) is inputted to the terminal 2 of the upper channel of the interface circuit 12, the waveform is shaped via the RC filter and the surge protection diodes into a waveform shown at FIG. 6(b), which is inputted to the base of the transistor 31. In response thereto, the transistor 31 outputs a shaped waveform shown at FIG. 6(c), which is inputted to the CPU (microcomputer) 13.

The operation of the lower channel is similar except for the polarity of the signals.

The above conventional input interface circuit, however, has the following disadvantage. The characteristics of the RC filter vary due to the variations of the components or in accordance with the variation of the ambient temperature. Thus, the capacity of the capacitor 28 must be designed at a large enough value which allow for a sufficient margin for such variations of the filter characteristics. Larger capacitors not only push up the production cost, but also occupy larger spaces on the substrate board of the interface circuit 12, which makes the high density mounting of the components very difficult.

For the purpose of increasing the mounting density of components, the whole interface circuit 12 may be formed as an integrated circuit. It is feasible, however, in the case of an analog system of as shown in FIG. 5, to produce the interface circuit 12 as a monolithic integrated circuit where the values of the resistances and capacitances are large. On the other hand, although the interface circuit 12 can be formed as a hybrid integrated circuit by mounting the components on a ceramic board, this method of production increases the cost and the number of steps required for the quality control.

SUMMARY OF THE INVENTION

It is therefore an object of this invention to provide an input interface circuit for an automotive CPU (microcomputer) which is reliable in operation, small in size which, and can be produced economically as an integrated circuit.

The above object is accomplished in accordance with the principle of this invention by an input interface circuit which comprises:

clock means for generating sampling timing signals at a predetermined sampling period;

sequential memory means, coupled to said clock means, for sampling levels of said input signal in response to said sampling timing signal, said sequential memory means storing at least two successive values of said input signal sampled at two successive sampling timing determining by said sampling timing signals; and signal output means, coupled to said sequential memory means, for generating an output signal to said electronic circuit component when the sampled values of said input signal are identical.

Preferably, the interface circuit includes a waveform shaping circuit means for shaping a waveform of said input signal into a two-values signal, wherein an output of said waveform shaping circuit means is supplied to said sequential memory means such that the sequential memory means samples levels of said input signal shaped via said waveform shaping circuit means; wherein said output signal of the signal output means rises to a high level when the levels stored in said sequential memory means are all at a high level, and falls to a low level when the levels stored in said sequential memory means are all at a low level. It is further preferred that said waveform shaping circuit includes level determining means which is set to output a high level signal when an input voltage thereto rises above a first reference voltage level $V_{TH}$, and which is reset to output a low level signal when an input voltage thereto falls below a second reference voltage level $V_{TL}$.

BRIEF DESCRIPTION OF THE DRAWINGS

The features which are believed to be characteristic of this invention are set forth with particularly in the appended claims. The structure and method of operation of this invention itself, however, will be best understood from the following detailed description, taken conjunction with the accompanying drawings, in which:

In the drawings, like reference numerals represent like or corresponding parts or portions.

DETAILED DESCRIPTION OF THE PREFERRED EMBODIMENT

Referring now to the accompanying drawings, the preferred embodiment of this invention is described.

Figure 1:
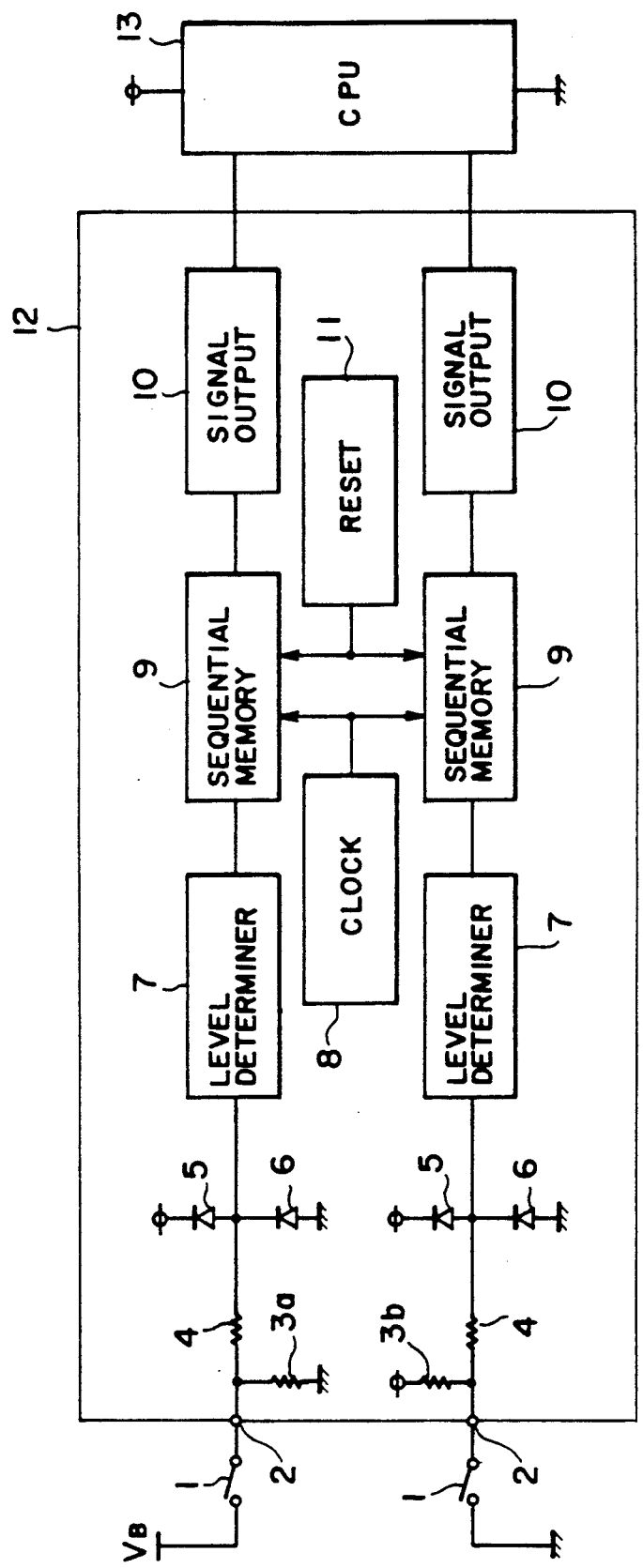
FIG. 1 is a diagram showing the organization of an input interface circuit for an automotive microcomputer according to this invention.
Figure 5:
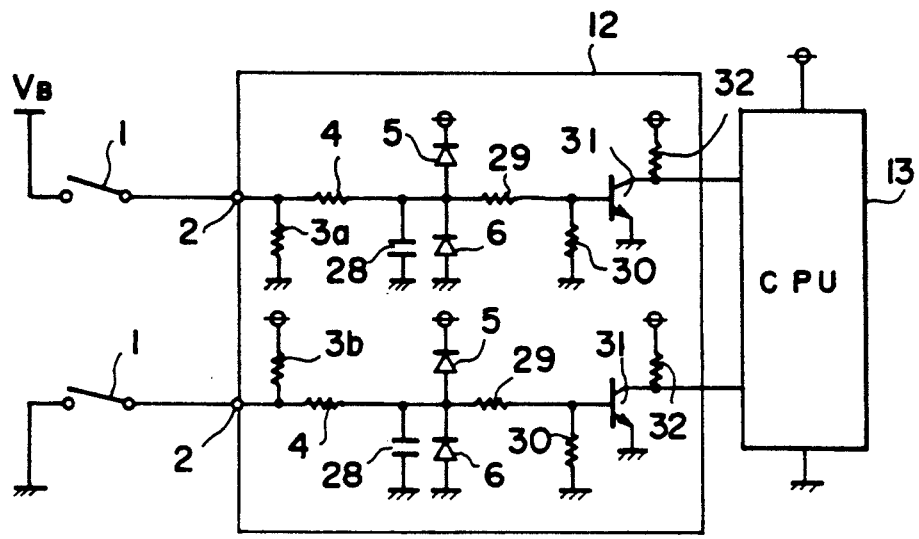
FIG. 5 is a circuit diagram showing the organization of a conventional input interface circuit for an automotive microcomputer (CPU)
Figure 6:
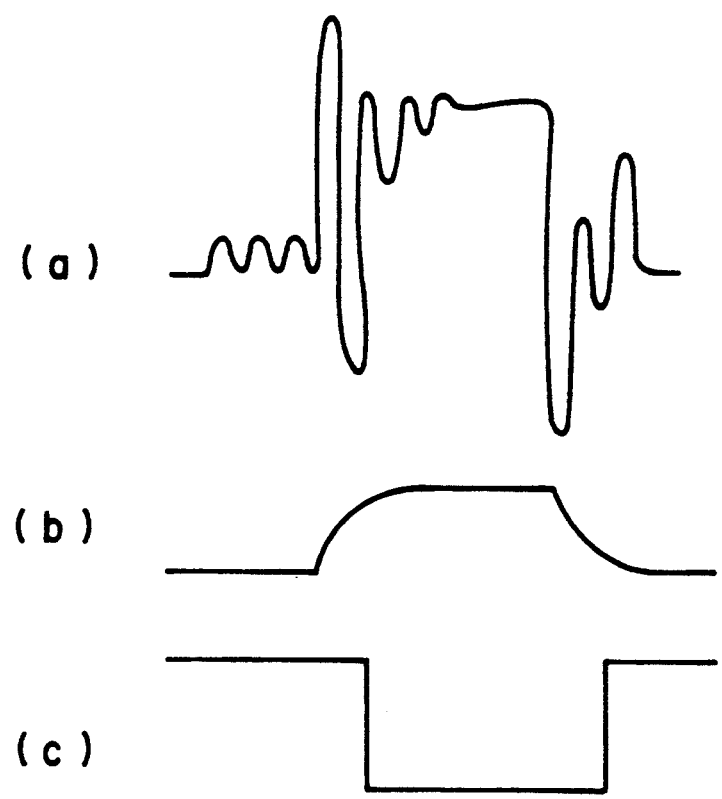
FIG. 6 shows waveforms generated within the circuit of FIG. 5.

FIG. 1 is a diagram showing the organization of an input interface circuit for an automotive microcomputer according to this invention, where the parts corresponding to those of FIG. 5 are designated by the same reference numerals. Thus, the two inputs signals, generated via the switches 1 and inputted to the interface circuit 12 via the input terminals 2, are pulled down or up via the pull-down resistor 3a or the pull-up resistor 3b, and then supplied to the circuit parts 7 through 11 via a resistor 4 and surge protection diodes 5 and 6 for clipping any voltage surge. The upper and lower channels for the two signal inputs are similar in their organization and method of operation except for the polarities of the signals.

Figure 4:
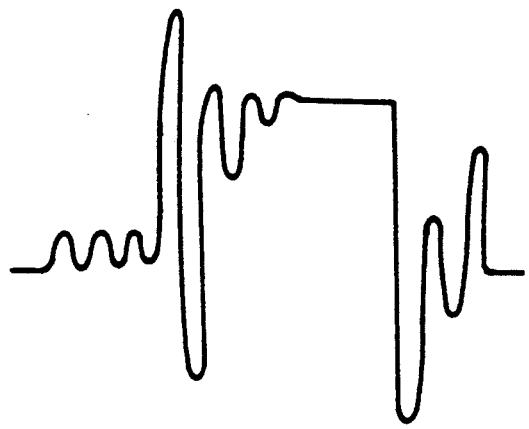
FIG. 4 shows waveforms generated within the input interface circuit of FIG. 1.
Figure 4:
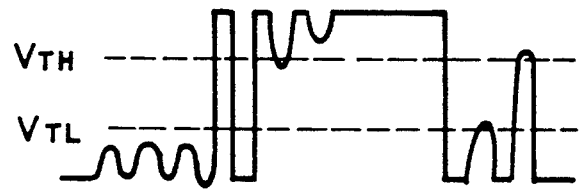
Figure 4:
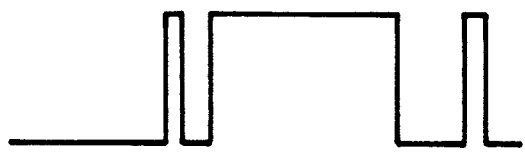
Figure 4:
Figure 4:
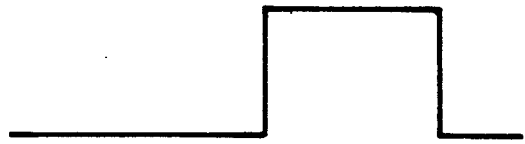

In each channel, when a waveform as shown at FIG. 4(a) is inputted to the terminal 2, the surge voltages thereof are clipped via the surge protection diodes 5 and 6. Thus, a waveform as shown at FIG. 4(b) is supplied to a level determining means 7. The level determining means 7 determines the level of the input supplied thereto. More specifically, the level determining means 7 is set (high) when the input voltage thereto rises above a first predetermined level, and is reset (low) when the input voltage falls below a second predetermined level which is lower than the first level. The output of the level determining means 7 is set (high) or reset (low) accordingly. Thus, the output of the level determining means 7 is a rectangular pulse-shaped (two-value) signal as shown at FIG. 4(c). The output from the level determining means 7 still contain noise pulses.

Figure 2:
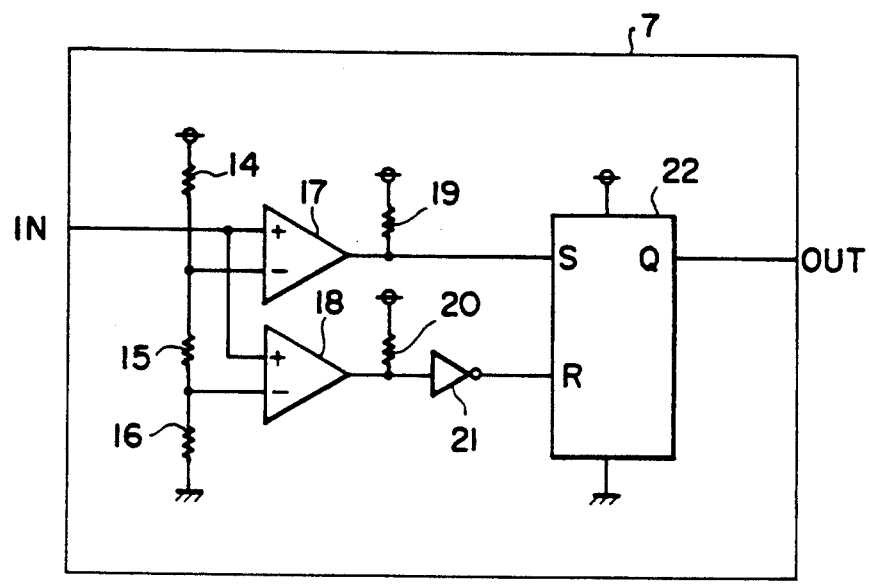
FIG. 2 is a circuit diagram showing an implementation of the level determining circuit of the input interface circuit of FIG. 1.

FIG. 2 is a circuit diagram showing an implementation of the level determining circuit of the input interface circuit of FIG. 1. Serially connected resistors 14 through 16 coupled across a voltage source and the ground constitute a voltage divider for providing a first reference voltage level $V_{TH}$ and a second reference voltage level $V_{TL}$, which are inputted to the negative terminal of the comparator 17 and the comparator 18, respectively. The positive terminal of the comparators 17 and 18 are coupled to the input terminal 2 via the resistor 4. The output of the comparator 17, coupled to a pull-up resistor 19, is connected to the setting input S of a R-S flip-flop 22. The output of the comparator 18, coupled to a pull-up resistor 20, is connected via an inverter 21 to the resetting input R of the R-S flip-flop 22.

As described above, when a waveform as shown at FIG. 4(a) is inputted to the terminal 2, the surge voltages thereof are clipped via the surge protection diodes 5 and 6. Thus, the waveform inputted to the comparators 17 and 18 of the level determining means 7 is as shown in FIG. 4(b). The comparator 17 compares it with the first reference voltage level $V_{TH}$ and outputs a high level signal to set the R-S flip-flop 22 when the input IN is higher than the first reference voltage level $V_{TH}$. Otherwise, the output of the comparator 17 is low. On the other hand, the output of the comparator 18 is high when the input IN is higher than the second reference voltage level $V_{TL}$, and is low otherwise. The output of the comparator 18 is inverted via the inverter 21 before being applied to the R input of the R-S flip-flop 22. Thus, the R-S flip-flop 22 is reset when the input IN falls below the second reference voltage level $V_{TL}$. Thus, the output Q of the R-S flip-flop 22 exhibits a waveform as shown in FIG. 4(c).

A clock means 8 output sampling clock pulses at a predetermined sampling period, as shown in FIG. 4(d). In response to the clock pulses of the clock means 8, a sequential memory means 9 sequentially stores a predetermined number n of consecutive output levels of the level determining means 7. For example, in the case where the predetermined number n is 2, the sequential memory means 9 stores the two most recent consecutive output levels of the level determining means 7 sampled at the sampling timings determined by the clock pulses of the clock means 8.

Figure 3:
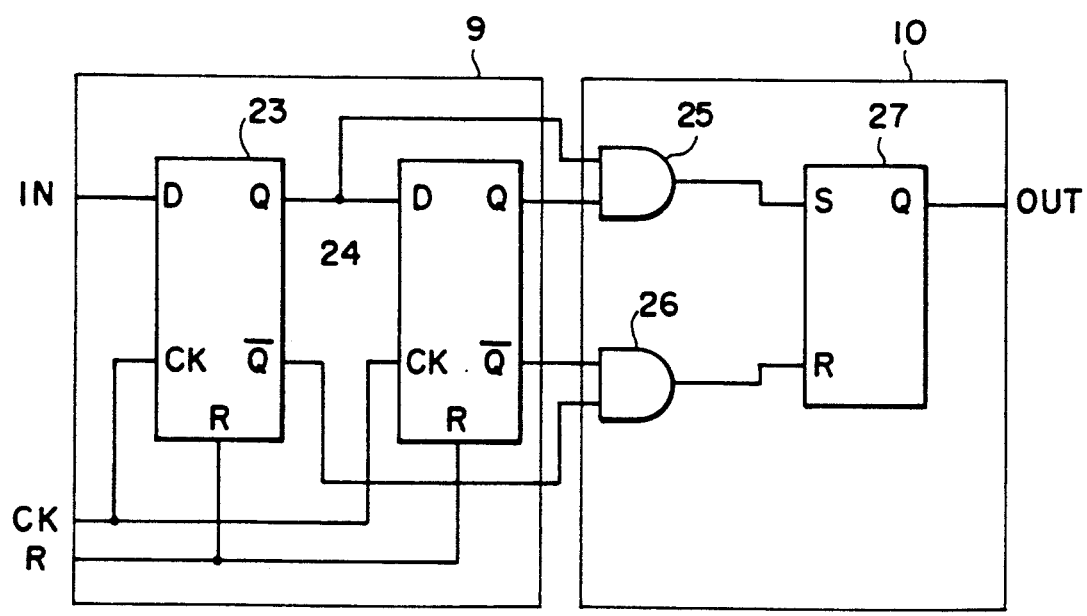
FIG. 3 is a diagram showing an implementation of the sequential memory and signal output circuit of the input interface circuit of FIG. 1.

FIG. 3 is a diagram showing an implementation of the sequential memory and signal output circuit of the input interface circuit of FIG. 1. The above predetermined number n is equal to two. The sequential memory means 9 is implemented by two clocked D flip-flops 23 and 24. The input D of the first clocked D flip-flop 23 is coupled to the output Q of the R-S flip-flop 22 of the level determining means 7. The clock inputs CK of the flip-flops 23 and 24 are coupled to the output of the clock means 8. The resetting terminals R of the flip-flop 23 and 24 are coupled to the output of a resetting means 11, which, by the way, resets both the flip-flop 23 and 24 to initialize them.

The first clocked D flip-flop 23 is set to turn the Q output thereof to the high level if the level of the input is high at a sampling timing. Namely, when the input D of the first clocked D flip-flop 23 is at the high level and, in addition, a clock pulse generated by the clock means 8 is applied on the input CK, the output Q of the first clocked D flip-flop 23 turns to the high level at the leading edge of the clock pulse. The output Q of the first clocked D flip-flop 23 is coupled to the input D of the second clocked D flip-flop 24. Thus, the second clocked D flip-flop 24 is set to turn the output Q thereof to the high level at the next sampling timing, if the current level of the output Q of the first clocked D flip-flop 23 is high. Both the flip-flops 23 and 24 are set if the input to the sequential memory means 9 is at the high level for two successive sampling timings.

The signal output means 10 includes two AND circuits 25 and 26 and a R-S flip-flop 27. The inputs of the first AND gate 25 are coupled to the (non-inverted) Q output terminals of the first and second flip-flops 23 and 24. The output of the first AND gate 25 is coupled to the setting input S of the R-S flip-flop 27. The inputs of the second AND gate 26 are coupled to the inverted output terminals Q of the first and the second flip-flops 23 and 24. The output of the second AND gate 26 is coupled to the resetting input R of the R-S flip-flop 27.

Thus, the output of the first AND gate 25 is at the high level (logical 1) to set the R-S flip-flop 27 when both the flip-flops 23 and 24 are set and hence both the outputs Q thereof are at the high level. Otherwise, the output of the first AND gate 25 is low (logical 0). On the other hand, the second AND gate 26 outputs a high level to reset the R-S flip-flop 27 when both the flip-flops 23 and 24 are rest, i.e., when the input to the sequential memory means 9 is low for two successive sampling timings.

Thus, only when the input to the sequential memory means 9 remains at the high level for two successive sampling timings, the R-S flip-flop 27 is set and the output Q thereof is turned to the high level. Similarly, only when the input to the sequential memory means 9 is at the low level for two successive sampling timings, the R-S flip-flop 27 is reset and the output Q thereof is turned to the low level. Otherwise, both the outputs of the AND gates 25 and 26 are at the low level (logical 0), and hence the R-S flip-flop 27 retains the current state. As a result, the waveform of the output of the R-S flip-flop 27, shown at FIG. 4(e), is outputted from the R-S flip-flop 27 of the signal output means 10 to the CPU (microcomputer) 13.

The noises which may cause the most problems for electronic control circuits for automobiles are the ones which continue for the longest period of time, such as when a horn is operated. The noise period can last about 1.1 milliseconds. Thus, if the noise filtering time length is selected greater than the length of the longest noise period, the adverse effects of such noise can completely be removed. For example, for the purpose of setting the filtering time length at 2 milliseconds, the sampling period may be selected at 1 millisecond.

Further, for the purpose of removing high frequency noises caused by radio wave radiations, a small capacitor may be inserted before the level determining means 7. However, a small capacitance, e.g., about 5 pF, suffices for such purpose.

What is claimed is:

1. An input interface circuit for shaping a waveform and removing noise components of an input signal applied to an electronic circuit component, comprising:
   a clipping circuit for clipping the input signal above and below predetermined thresholds, respectively;
   waveform shaping circuit including a level determining circuit for shaping a waveform of an output of said clipping circuit, said level determining circuit comprising a voltage divider for providing first and second predetermined thresholds, first and second comparators, coupled to said first and second thresholds, respectively, and each coupled to the output of said clipping circuit, and output means coupled to an output of said first and second comparators, said first comparator causing said output means to produce a high output when the output of said clipping circuit exceeds said first predetermined level and said second comparator causing said output means to produce a low output when the output of said clipping circuit is below said second predetermined threshold;
   clock means for generating sampling timing signals at a predetermined sampling period;
   sequential memory means, coupled to said clock means, for sampling levels of an output of said waveform shaping circuit in response to said sampling timing signal, said sequential memory means storing at least two successive values of said output of said waveform shaping circuit sampled at two successive sampling timings determined by said sampling timing signals; and
   signal output means, coupled to said sequential memory means, for generating a high level output signal to said electronic circuit component when each of the stored values are at a high level and a low level output to said electronic circuit component when each of the stored values are at a low level.

2. An input interface circuit as claimed in claim 1, wherein: said sequential memory means comprises at least two D flip-flops for storing successively samples levels of said input signals shaped via said waveform shaping circuit means, said D flip-flops each having a non-inverted and an inverted output terminal and being clocked by said sampling timing signals generated by said clock means.

3. An input interface circuit as claimed in claim 2, wherein said signal output means comprises:
   a first AND gate having inputs coupled to the non-inverted output terminals of said D flip-flops;
   a second AND gate having inputs coupled to inverted output terminals of said D flip-flops; and
   a R-S flip-flop having a setting and a resetting input terminal coupled to output terminals of said first AND gate and second AND gate, respectively.

* * * * *